(12) United States Patent
Pietsch et al.

(10) Patent No.: US 7,867,059 B2
(45) Date of Patent: Jan. 11, 2011

(54) SEMICONDUCTOR WAFER, APPARATUS AND PROCESS FOR PRODUCING THE SEMICONDUCTOR WAFER

(75) Inventors: Georg Pietsch, Burghausen (DE); Michael Kerstan, Burghausen (DE); Werner Blaha, Altötting (DE)

(73) Assignee: Siltronic AG, Munich (DE)

( * ) Notice: Subject to any disclaimer, the term of this patent is extended or adjusted under 35 U.S.C. 154(b) by 334 days.

(21) Appl. No.: 11/941,171

(22) Filed: Nov. 16, 2007

(65) Prior Publication Data

US 2009/0203297 A1 Aug. 13, 2009

Related U.S. Application Data

(62) Division of application No. 11/051,894, filed on Feb. 4, 2005, now abandoned.

(30) Foreign Application Priority Data

Feb. 5, 2004 (DE) ........................ 10 2004 005 702

(51) Int. Cl.
*B24B 49/00* (2006.01)
(52) U.S. Cl. .............................. 451/11; 451/41; 451/57; 451/63; 451/262; 451/269; 451/287
(58) Field of Classification Search ...................... 451/9, 451/10, 11, 41, 57, 63, 261, 262, 267, 268, 451/287, 269, 288; 438/690, 691, 692; 237/E21.23, 237/E21.237
See application file for complete search history.

(56) References Cited

U.S. PATENT DOCUMENTS

| | | | |
|---|---|---|---|
| 3,885,925 A | | 5/1975 | Tatar |
| 5,942,445 A | | 8/1999 | Kato et al. |
| 6,066,565 A | * | 5/2000 | Kuroki et al. ............... 438/692 |
| 6,114,245 A | * | 9/2000 | Vandamme et al. ......... 438/690 |
| 6,458,688 B1 | | 10/2002 | Wenski et al. |
| 6,861,360 B2 | | 3/2005 | Wenski et al. |
| 6,997,776 B2 | | 2/2006 | Kann et al. |

(Continued)

FOREIGN PATENT DOCUMENTS

EP 0 868 974 A2 10/1998

(Continued)

OTHER PUBLICATIONS

English Patent Abstract of Japan corresponding to JP2000-198068A.

*Primary Examiner*—Eileen P. Morgan
(74) *Attorney, Agent, or Firm*—Brooks Kushman P.C.

(57) ABSTRACT

The invention relates to a process for producing a semiconductor wafer by double-side grinding of the semiconductor wafer, in which the semiconductor wafer is simultaneously ground on both sides, first by rough-grinding and then by finish-grinding, using a grinding tool. The semiconductor wafer, between the rough-grinding and the finish-grinding, remains positioned in the grinding machine, and the grinding tool continues to apply a substantially constant load during the transition from rough-grinding to finish-grinding. The invention also relates to an apparatus for carrying out the process and to a semiconductor wafer having a local flatness value on a front surface of less than 16 nm in a measurement window of 2 mm×2 mm area and of less than 40 nm in a measurement window of 10 mm×10 mm area.

16 Claims, 7 Drawing Sheets

U.S. PATENT DOCUMENTS

| | | |
|---|---|---|
| 7,077,726 B2 * | 7/2006 | Pietsch et al. .................. 451/41 |
| 7,137,874 B1 | 11/2006 | Bovio et al. |
| 2002/0081943 A1 * | 6/2002 | Hendron et al. ................. 451/8 |
| 2003/0060020 A1 | 3/2003 | Walitzki et al. |
| 2003/0060050 A1 * | 3/2003 | Pietsch et al. ................. 438/692 |
| 2003/0171075 A1 * | 9/2003 | Nihonmatsu et al. .......... 451/41 |
| 2004/0038544 A1 * | 2/2004 | Zhang et al. ................. 438/709 |

FOREIGN PATENT DOCUMENTS

| | | |
|---|---|---|
| JP | 52-143593 | 11/1977 |
| JP | 11-254312 | 9/1999 |
| JP | 11-254313 | 9/1999 |
| JP | 200198068 A1 | 7/2000 |
| KR | 2001-107686 | 12/2001 |
| KR | 2003-32700 | 4/2003 |
| WO | 99/39873 | 8/1999 |
| WO | 2001/078125 | 10/2001 |

* cited by examiner

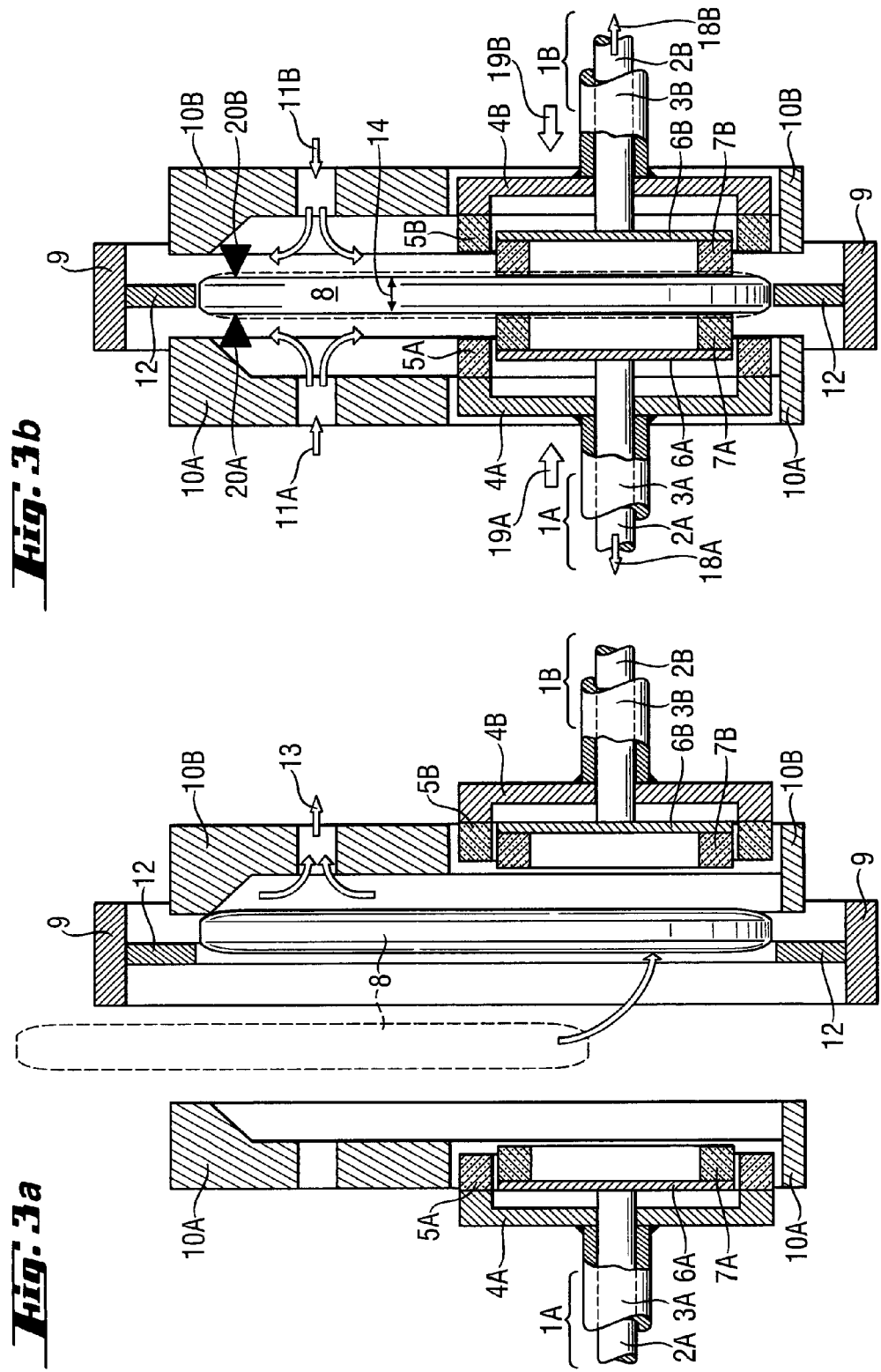

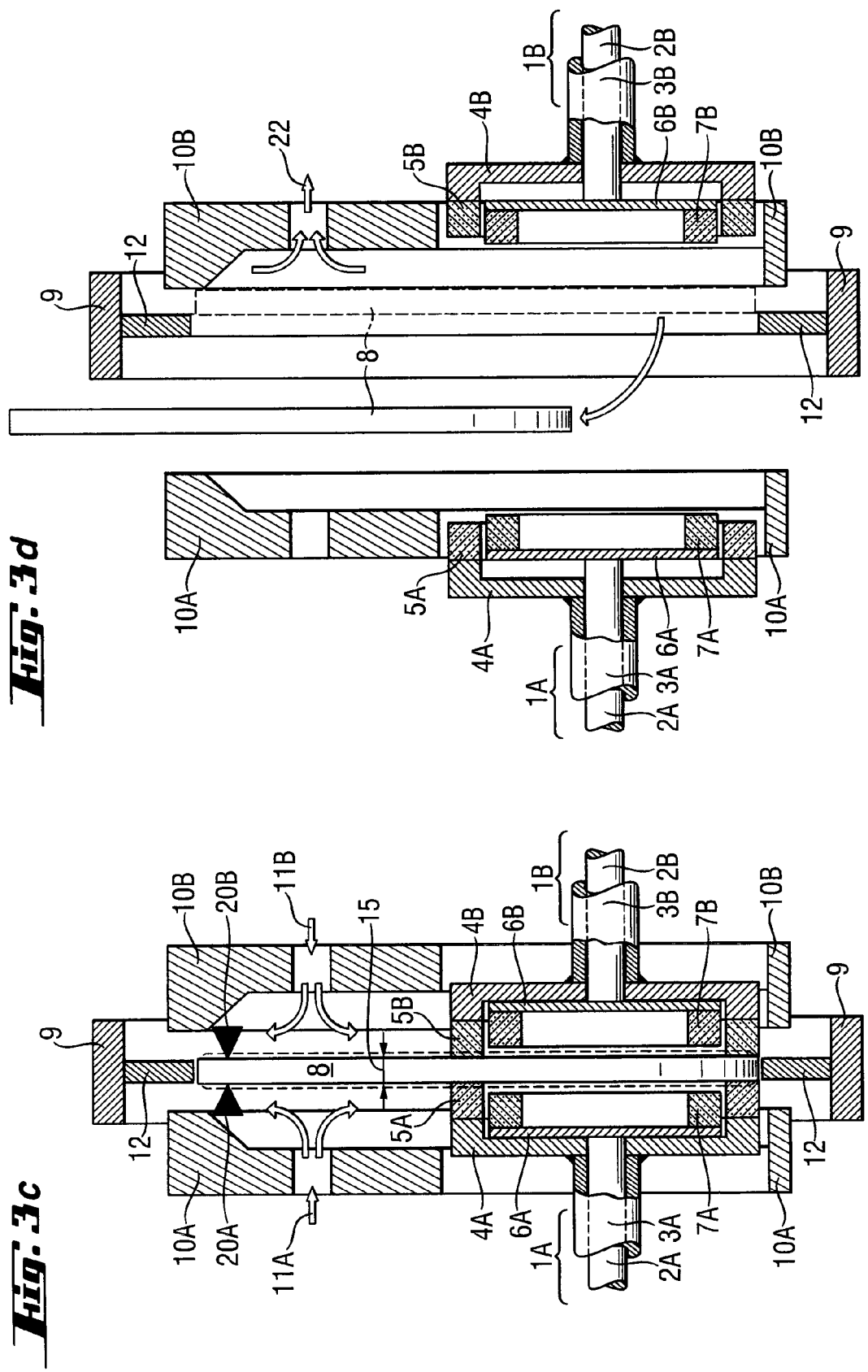

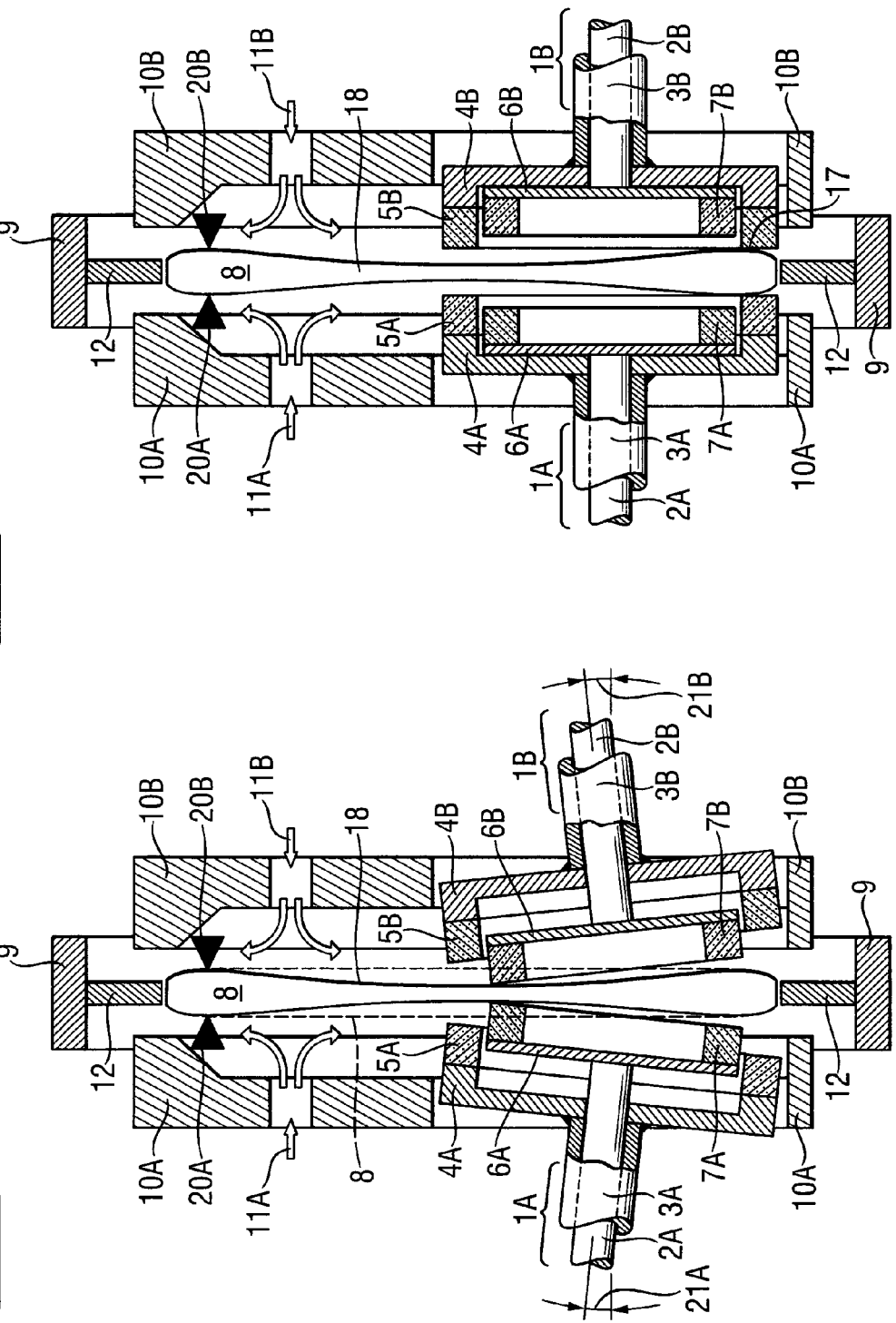

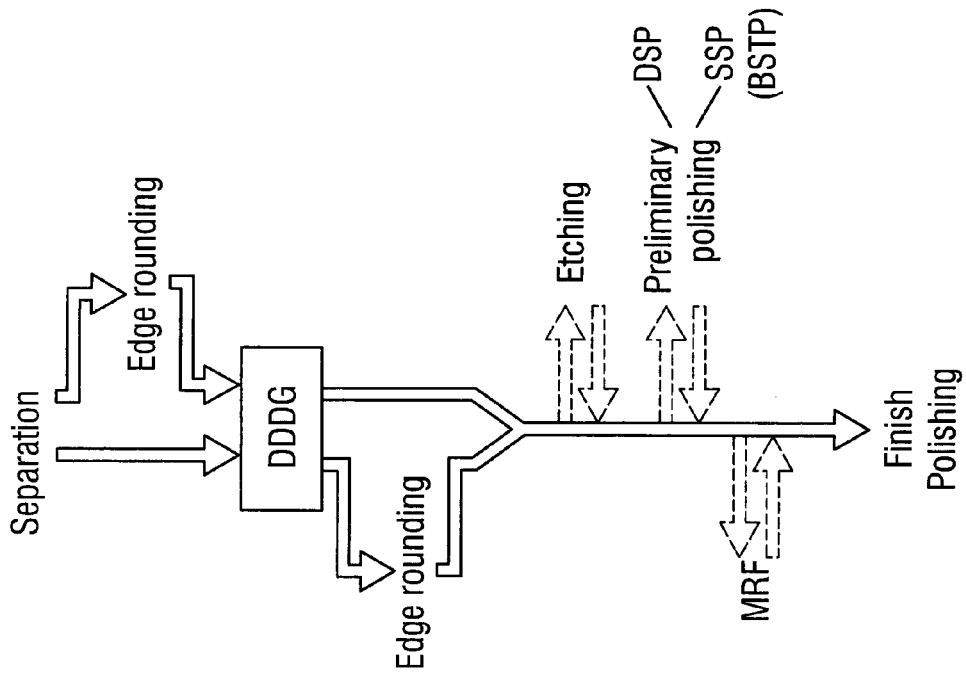
Fig. 4-b
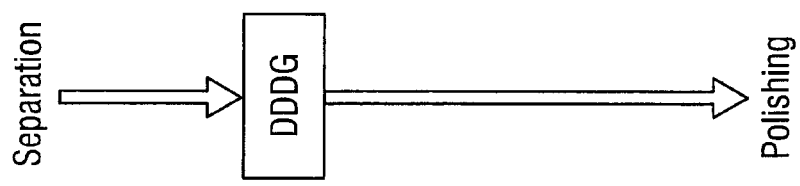
Fig. 4-a

SEMICONDUCTOR WAFER, APPARATUS AND PROCESS FOR PRODUCING THE SEMICONDUCTOR WAFER

This application is a division of U.S. application Ser. No. 11/051,894 filed Feb. 4, 2005, and claims priority to that application and to German application DE 10 2004 005 702.8 filed Feb. 5, 2004.

BACKGROUND OF THE INVENTION

1. Field of the Invention

The present invention relates to a process for producing an especially planar semiconductor wafer with good nanotopology and a low-damage finish after machining, to a semiconductor wafer of this type, and to an apparatus for the double-side grinding of flat workpieces.

2. Background Art

Electronics, microelectronics and (micro)electromechanics require starting materials (substrates) with extremely high demands imposed on global and local flatness, thickness distribution, single surface referenced local flatness (nanotopology), roughness, and cleanliness. Depending on the intended use, the substrates used are wafers made from metals, insulators, or semiconductor material, in particular, compound semiconductors such as gallium arsenide, and primarily, elemental semiconductors such as silicon and sometimes germanium. Furthermore, the term semiconductor wafers is also to be understood as meaning substrates with artificially produced layer structures, such as for example silicon on silicon dioxide (SOI, silicon on insulator), preferably epitaxially produced silicon-germanium solid solutions (strained silicon), and silicon-germanium solid solutions on silicon dioxide (sSOI, strained SOI). For use in microelectronics in particular, semiconductor wafers have to have a particularly constant thickness, a global and local flatness, and must be smooth and clean.

The front surface (component surface) referenced flatness of semiconductor wafers within measurement windows, arranged on the surface of, for example 2 mm×2 mm or 10 mm×10 mm is reported in accordance with SEMI (Semiconductor Equipment and Materials International) as the "nanotopology". Each new generation of components (design rule), defined on the basis of the smallest feature sizes which can still be produced in a defined and reproducible way, however, places increased demands on the nanotopology. Even at the present time, the demands for 130 nm, 90 nm and 65 nm generation features need to be satisfied.

According to prior art, silicon semiconductor wafers are produced in a large number of successive process steps, which can generally be divided into the following groups:
a) production of a single-crystal silicon ingot (crystal growth)
b) dividing the ingot into individual wafers (wafering, sawing)
c) mechanical machining
d) chemical machining
e) chemico-mechanical machining
f) if appropriate, coating Furthermore, there are a large number of auxiliary steps, such as cleaning, classifying, measuring, packaging, etc., but these have no direct influence on the wafer flatness, or in particular on the nanotopology, and therefore are not considered in any more detail in the text which follows.

A single-crystal silicon ingot is usually produced by crucible pulling (Czochralski method). Furthermore, ingots with a diameter of <200 mm are also produced by float zone pulling (recrystallization of an ingot from polycrystalline silicon).

Preferred dividing processes include wire sawing (multi-wire slicing, MWS) with free grain (slurry MWS) or with bonded grain (Diamond wire MWS). Mechanical machining is used to remove sawing unevenness, to remove the surface layers whose crystallinity has been damaged by the relatively rough sawing processes or which have been contaminated by the sawing wire, and in particular for global leveling of the semiconductor wafers. In this context, sequential single-side grinding (SSG) and simultaneous double-side grinding (double-disk grinding, DDG) processes, as well as lapping and flat-honing, are used.

In the case of single-side grinding, the back surface of the semiconductor wafer is held on a chuck, while the front surface is leveled by a cup or, less often, by an outer grinding wheel, with the chuck and grinding wheel rotating and slowly being fed radially toward one another.

In the case of simultaneous double-side grinding, as described, for example, in EP-868 974A2, the semiconductor wafer is machined on both sides simultaneously while it is floating freely between two grinding wheels mounted on opposite, co-linear spindles, with axial guidance, substantially without any imposed forces, provided by a water cushion (hydrostatic principle) or air cushion (aerostatic principle) acting on the front surface and the back surface. The wafer is loosely prevented from floating off in the radial direction by a surrounding thin guide ring or individual radial spokes. The semiconductor wafer rotates about its axis of symmetry during grinding. This rotation is driven by friction wheels acting on the front surface and the back surface by a notch finger which engages the orientation notch in the semiconductor wafer, or by friction belts which are wrapped around part of the circumference of the semiconductor wafer. Precise orientation of the spindles with respect to one another (co-linearity) and of the center plane between the grinding wheels and the middle plane of the semiconductor wafer (co-planarity) are of particular importance to the success of DDG, with a view to achieving very good geometry and nanotopology values for the semiconductor wafer. Furthermore, the arrangement, pressure, thickness, through-flow rate and uniform shaping of the air or water cushions (hydro-pads) are particularly important. The apparatus for generating these air or water cushions may be arranged rigidly, in which case the decreasing thickness of the semiconductor wafer causes the thickness of the air or water cushions to increase during grinding, or may be adjusted during grinding, preferably controlled so as to achieve a constant thickness of the air or water cushions during the removal of material. To ensure precise orientation, a series of different measurement devices are used, monitoring the position of the semiconductor wafer and counteracting any asymmetry which may arise by axial displacement of the spindles. In addition, for absolute measurement of the position of the semiconductor wafer, the thickness of the wafer is also generally determined in situ by synchronous scanning of the front and back surfaces, and this measurement is used to control the grinding process steps (spindle feed) and in particular to terminate the process accurately at the required thickness.

The edge of the semiconductor wafer generally also has to be machined (edge rounding). Conventional grinding steps with profiled grinding wheels, belt grinding processes with continuous or periodic tool advance or integrated edge-rounding processes (edge grinding and polishing in one step) are used for this purpose.

The chemical machining steps comprise cleaning and etching steps, in particular for the removal of impurities, for the removal of damaged surface layers, and for reducing the surface roughness. Etching steps using alkaline media, in particular based on NaOH, KOH or tetramethylammonium hydroxide (TMAH); etching steps using acidic media, in particular based on mixtures of $HNO_3$/HF; or combinations of these etching steps, are used during etching. In some cases, other etching processes such as plasma etching are also used.

The chemico-mechanical machining steps comprise polishing steps which smooth the surface, partially by chemical reaction and partially by mechanical removal of material (abrasion). In the case of single-side polishing (SSP), the back surface of the semiconductor wafer is held on a carrier plate using cement, vacuum, or adhesion during machining. In the case of double-side polishing (DSP), the semiconductor wafer is placed loosely in a thin, toothed disc and is polished on the front and back surface simultaneously in a "free-floating" position between an upper and a lower polishing plate covered with a polishing cloth. The polishing generally comprises one or more preliminary (material-removal polishing) and haze-free (finish polishing) polishing steps and if appropriate, also intermediate steps (buff polishing). The rough polishing can be carried out as single-wafer or multi-wafer SSP or DSP. For haze-free polishing, only SSP in the form of single-wafer polishing or multi-wafer polishing is used, on account of the higher frictional forces (softer polishing cloth).

Particularly demanding applications may require precision remachining of the semiconductor wafer in addition to the processes listed, so that any deviations in shape can be deliberately remachined at a local level. Examples of subaperture processes, as they are known, include plasma-assisted chemical etching (PACE) and related plasma etching processes, for example the jet-etch process. A relatively new subaperture process with considerable potential is magneto-rheological finishing (MRF), which is described in more detail, for example, in US2003/060020A1 and can be carried out as single-wafer or multi-wafer machining process. The MRF process uses a magneto-rheological liquid (ferro-fluid), the viscosity of which increases in the magnetic field by up to many orders of magnitude as a function of the field strength, for the local removal of material. This allows local production of a rigid (magnetically "thickened") "grinding tool" which can be used to grind the surface of the semiconductor wafer. The flatnesses which can be achieved with the MRF process are superior to those of polishing by up to one order of magnitude, albeit with a much greater machining outlay (cycle time).

It is preferable for multi-stage material-removing mechanical machining steps to be used to produce especially flat semiconductor wafers with a good nanotopology. By way of example, U.S. Pat. No. 5,942,445 describes a process which comprises a sequence made up of a first, rough grinding step in a first grinding machine, with DDG preferably being used, followed by sequential SSG of both sides using a finishing grinding wheel in a second grinding machine. However, this multi-stage process sequence is complex, relatively inflexible, and overall requires very large amounts of material to be removed on account of repeated grinding operations. In particular, however, the SSG largely destroys the advantages of the preceding DDG.

U.S. Pat. No. 6,066,565 describes a process sequence involving a two-stage mechanical planarization step, in which the rounding of the edge of the semiconductor wafer is carried out between the first mechanical planarization step and the second mechanical planarization step and in which the two planarization steps are in each case selected independently from a whole group of proposed mechanical machining processes. The group includes DDG, SSG, lapping and plasma etching. This process sequence is likewise complex, material-intensive, susceptible to faults, and expensive.

SUMMARY OF THE INVENTION

An object of the present invention is in particular the economic production of an especially flat semiconductor wafer with good nanotopology and a low-damage finish following mechanical machining, which allows a reduction in any removal of material in subsequent process steps which may be necessary. These and other objects are achieved by a process for producing a semiconductor wafer, comprising double-side grinding of the semiconductor wafer, in which the semiconductor wafer is simultaneously ground, on both sides using a grinding tool, firstly by rough-grinding and then by finish-grinding, wherein the semiconductor wafer, between rough-grinding and finish-grinding, remains clamped in a grinding machine, and the grinding tool continues to apply a substantially constant load during the transition from rough-grinding to finish-grinding.

The subject matter of the invention also pertains to an apparatus for the double-side grinding of flat workpieces, comprising two double spindles each having an inner sub-spindle and an outer sub-spindle, a device for loading and unloading the workpiece, and a workpiece holder which is arranged between the double spindles and by which the workpiece is held in a free-floating position during a grinding step, the sub-spindles being arranged coaxially and bearing grinding wheels for grinding opposite sides of the workpiece, and in each case at least one sub-spindle per double spindle being axially displaceable independently of the other sub-spindle of the double spindle.

BRIEF DESCRIPTION OF THE DRAWINGS

FIG. 3a) shows the loading of the grinding apparatus.

FIG. 4a indicates the main steps involved in a general process incorporating the invention, for producing particularly flat and plane-parallel semiconductor wafers. FIG. 4b) indicates particularly preferred embodiments of the general process which encompass further process steps.

DETAILED DESCRIPTION OF THE PREFERRED EMBODIMENT(S)

Figure 1:
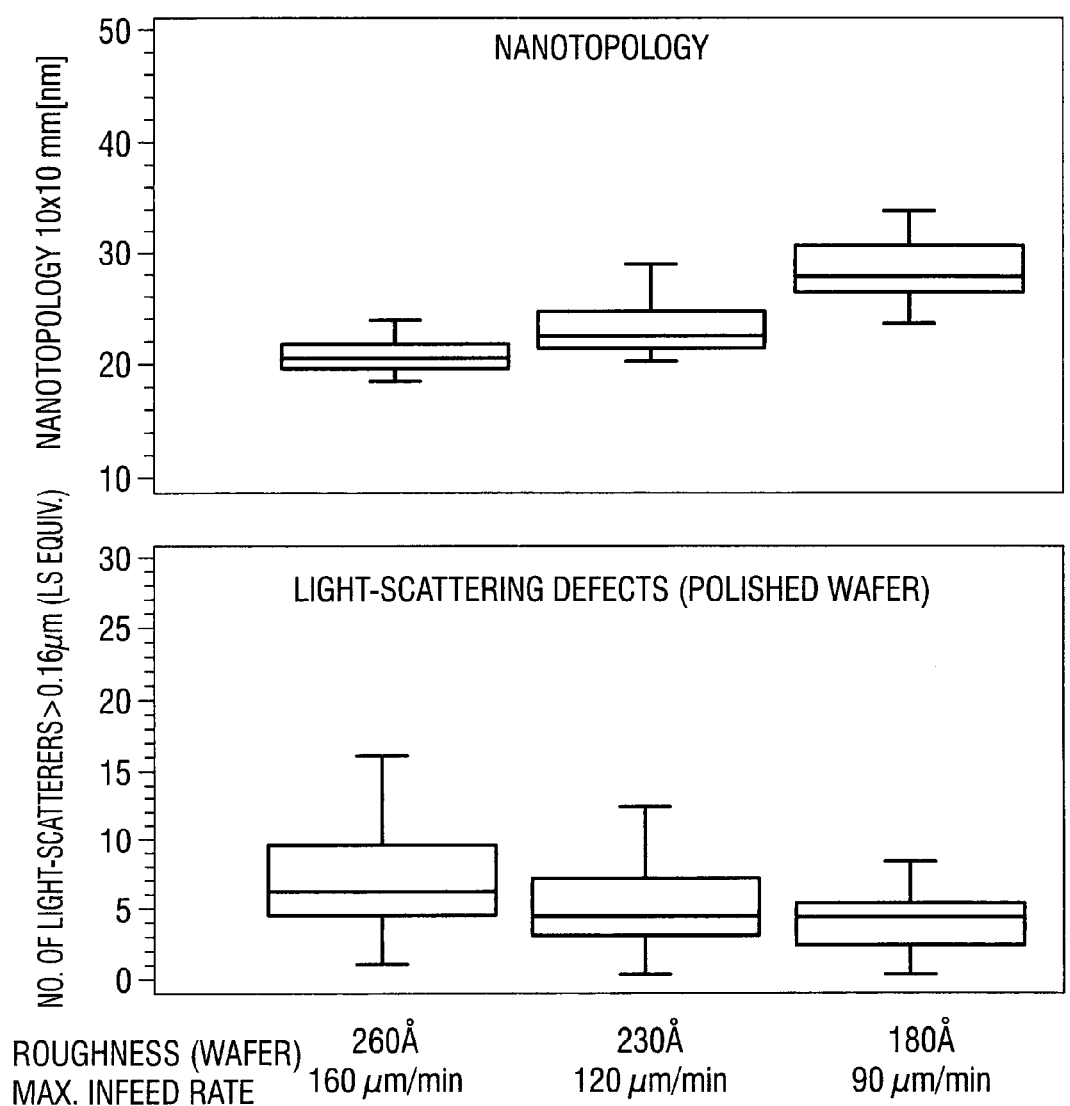
FIG. 1 shows the result of measurements of the nanotopology and of light-scattering surface defects for rough-ground and polished semiconductor wafers, in which grinding wheels with differing cutting abilities were used for the rough-grinding.

The apparatus differs from prior art, as represented, for example by U.S. Pat. No. 3,885,925 and WO 99/39873A1, in particular by the provision of two double spindles, since it is only by this provision that the claimed process may be carried out.

According to one embodiment of the process according to the invention, simultaneous double-side grinding, which comprises rough-machining and finish-machining of the semiconductor wafer, is carried out in one uninterrupted working step in a machine, the semiconductor wafer being ground between a pair of co-linearly arranged double spindles, the middle plane of the semiconductor wafer and the center plane between the grinding wheels being coplanar.

According to a second embodiment of the inventive process, a simultaneous double-side grinding operation, which comprises rough-machining and finish-machining of the semiconductor wafer, is carried out in one interrupted working step in a machine, the semiconductor wafer being ground between a pair of double spindles, the middle plane of the semiconductor wafer and the center plane between the grinding wheels being coplanar. Unlike the first embodiment, the double spindles are tilted out of a co-linear arrangement during the rough-grinding but are oriented co-linearly again during the finish-grinding.

The process is, in particular, distinguished by the fact that the simultaneous double-side machining of the semiconductor wafer during a change from rough-grinding to finish-grinding takes place substantially without a change in load and therefore in one substantially uninterrupted working step. During a change from rough-grinding to finish-grinding, the two finish-grinding wheels of the double spindles are brought into engagement on the front and back surfaces in such a way that the semiconductor wafer, during the change of engagement, does not leave its force-free centered position between the holding cushions which provide it with axial guidance. As a result, the process is substantially free of undesirable forces which have a deforming action. To achieve this result, the actual position of the grinding wheel front edges, the position of which is subject to change on account of the wear of the grinding surface, are determined and adjusted by monitoring the position and thickness of the semiconductor wafer in such a way that grinding can always be carried out with a minimum, preferably virtually negligible safety margin (air-cut) before the grinding wheels begin to act on the substrate.

This substantial absence of load changes is converted in accordance with the second embodiment of the process by deliberately establishing a non-planar shape of the semiconductor wafer during rough-grinding through adjustment of the inclination of the double spindles, and by preventing the finish-grinding wheel, during finish-grinding, to suddenly come into complete circumferential engagement with the semiconductor wafer, due to the shape of the rough-ground semiconductor wafer. Rather, engagement occurs slowly, with continuous, non-abrupt changes of force into the semiconductor wafer which has been rough-ground in non-planar form, so that the ultimate desired plane-parallelism of the semiconductor wafer is only produced during finish-grinding.

The multi-stage interruption-free machining by means of double spindles with respective grinding wheels for rough-grinding and finish-grinding (e.g. dual-spindle double-disk grinding, DDDG) which occurs with substantially no load changes in conjunction with force-free workpiece guidance and simultaneous machining of the front and back surfaces, avoids the previously described drawbacks of multi-stage machining processes in different machines and using different tools, resulting in numerous advantages.

Rapid machining is ensured by the process, since a complete loading and unloading cycle, which, on account of the required accuracy, fundamentally takes a very long time during double-side grinding with a machine change is eliminated. It is possible to use virtually any desired combinations of rough/finishing-grinding wheels, in particular including those whose rough-grinding wheel produces such rough surfaces that the semiconductor wafer would be unable to withstand a conventional process involving rough-grinding and finish-grinding with a machine change, on account of its high susceptibility to fracture during the handling involved in loading and unloading or during transportation.

Finish-grinding wheels for producing particularly low-damage and smooth surfaces, however, exhibit some reluctance to actually cut, and thus typically require an initially ground roughness, i.e. for example a rough-preground surface, to be able to act on the semiconductor wafer at all. The proposed process makes it possible to produce a surface finish which is not economically possible with a corresponding multi-stage grinding process with a machine change, as it has been found that subsequent grinding using finish-grinding wheels with a particularly fine abrasive surface also requires extremely slow infeed of the finish-grinding wheel when used on rough-preground surfaces. If the finish-grinding wheel is fed in too quickly, the previously mentioned reluctance to cut causes load peaks to occur, which can lead to an overload at the notch or notch finger, and cause the semiconductor wafer to fracture. A slow infeed is only possible with economic cycle times if a virtually negligible air-cut is employed prior to the onset of cutting by the finish grinding wheels.

In conventional processes which involve a machine change, fluctuations caused by thermal drift represent an obstacle to short cycle times. In the single-machine, double-spindle, double-side simultaneous grinding (DDDG) according to the invention, economic viability is ensured on account of the direct sequence of rough-grinding and finish-grinding steps, since there is no thermal drift between the two sub-steps, and since the final thickness achieved during rough-grinding, which is simultaneously the starting thickness of the wafer during finish-grinding, can be monitored and controlled in situ much more accurately, especially since the same measurement tool can be used for this purpose. Thus, the air-cut time can be minimized since the surface positions are accurately known.

With respect to FIG. 1: this figure shows the statistical distribution (mean, quartiles, 2-sigma values, outliers; box-and-whisker plot) of the nanotopology (top) and of the light-scattering surface defects (bottom) of groups of polished semiconductor wafers which had been simultaneously double-side ground using DDG grinding wheels of different levels of coarseness and therefore different cutting abilities. It can be seen that the more aggressive the grinding wheel, e.g. the rougher, and hence more rapid cutting properties, the better the measured nanotopology but also the higher the residual damage to the surface of the semiconductor wafer after etching and polishing. It is clear that a good nanotopology and a low-damage surface cannot be obtained simultaneously using just one grinding wheel. Rather, a double-machining step involving rough-grinding and finish-grinding is required; according to the invention, such a process is carried out using a DDDG apparatus.

Figure 2:
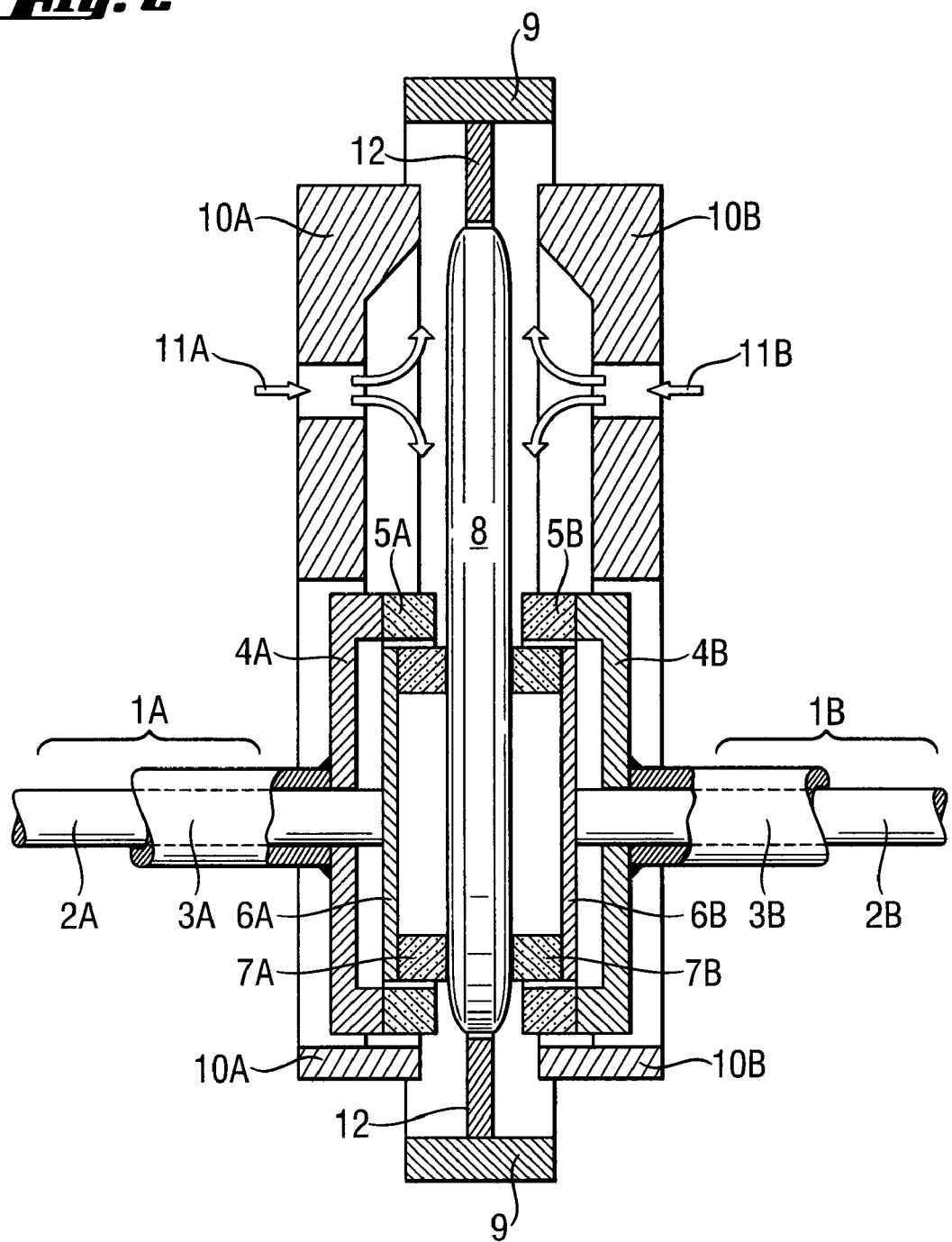
FIG. 2 shows the basic principle of an apparatus according to the invention for single-machine double-spindle double-side simultaneous grinding (DDDG).

FIG. 2 shows an outline sketch of the apparatus according to the invention for single-machine double-spindle double-side simultaneous grinding (DDDG) with double spindles 1A (left-hand double spindle) and 1B (right-hand double spindle) positioned opposite one another and oriented co-linearly. The double spindles (1A, 1B) comprise an inner rough-grinding spindle (2A, 2B) and an outer finish-grinding spindle (3A, 3B) arranged coaxially, which respectively bear a rough-grinding wheel (6A, 6B) and a finish-grinding wheel (4A, 4B). The grinding wheels have grinding coatings with coarse abrasive grain (7A, 7B) and fine abrasive grain (5A, 5B), respectively. Alternatively, it is also possible for the rough-grinding wheel and the finish-grinding wheel to be in the reverse arrangement i.e. for the rough-grinding wheel to be on the outside in relation to the finish-grinding wheel. A semiconductor wafer 8 is guided loosely in the axial direction on the front and back surfaces by a workpiece holder comprising water or air cushions (11A, 11B), known as hydro-pads or air-pads. The semiconductor wafer 8 is prevented from floating off in the radial direction by a ring 12 surrounding its circumference; the ring is continuous or comprises spoke-like portions. The ring 12 is thinner than the final thickness of the semiconductor wafer 8 and is clamped in a stable carrier ring 9.

In accordance with FIG. 3a), at the start of the process according to the invention, the grinding chamber, which is delimited by side walls (10A, 10B), is opened and loaded with a semiconductor wafer 8. The grinding spindles (1A, 1B) bearing the rough- and finish-grinding wheels (6A, 6B) and (4A, 4B) on the inner (2A, 2B) and outer (3A, 3B) sub-spindles are retracted. The semiconductor wafer 8 is introduced into the grinding chamber, for example, by a robot arm as loading device (not shown). When the loading device is retracted, it is ensured that the semiconductor wafer remains in the grinding chamber, for example by the application of a vacuum 13 in the right-handed part of the grinding chamber. Then, the grinding chamber is closed by the side wall 10A moving back. At the instant illustrated in FIG. 3b), the inner sub-spindles (2A, 2B) of the double spindles (1A, 1B), which are able to execute a fixed lifting movement in the axial direction with respect to the outer sub-spindles (3A, 3B), are in an advanced position, so that when the double spindles (1A, 1B) are fed onto the semiconductor wafer 8, only the rough-grinding wheels (6A, 6B) act on the semiconductor wafer 8. The semiconductor wafer 8 floats between the water or air cushions (11A, 11B) without being subjected to any forces and its middle plane is located co-planar with the center plane between the grinding wheels. The rough-grinding wheels (6A, 6B) grind the semiconductor wafer 8 by slow infeed of the rotating double spindles (1A, 1B) into the rotating semiconductor wafer 8, down to a rough-ground target thickness 14. A measurement means (20A, 20B), which operates in situ, scans the front surface and back surface of the semiconductor wafer simultaneously and thereby continuously determines the instantaneous thickness of the semiconductor wafer as grinding progresses, and detects that the rough-ground target thickness 14 has been reached. A comparison with the actual position of the spindles (1A, 1B) at the instant at which the target thickness is reached at the end of the rough-grinding step and the finish-grinding step allows the actual instantaneous heights of the grinding coverings (7A, 7B) and (5A, 5B) of the rough-grinding wheel (6A, 6B) and the finish-grinding wheel (4A, 4B) to be determined independently of one another and to be used for the required axial position corrections of the respective spindle settings. The measurement means (20A, 20B) or further proximity sensors also ensure that the middle plane of the semiconductor wafer 8 is constantly in the center plane between the grinding wheels. Furthermore, the positions of the double spindles are corrected by the actual positions of the front edges of the grinding coverings (7A, 7B) and (5A, 5B) determined when the target thickness is reached, so that the front edges of the grinding coverings are likewise fed symmetrically onto this center plane during grinding. This ensures that the semiconductor wafer 8 does not leave a force-free center position and in particular that no or scarcely any imposed forces are acting on it, in particular at the critical moment when grinding starts and finishes (insertion and retraction).

When the rough-ground target thickness 14 has been reached, the inner sub-spindles (2A, 2B) are retracted by the amount (18A, 18B) determined by the axial retracting mechanism, so that the rough-grinding wheels (6A, 6B) are brought out of engagement with the semiconductor wafer 8 and the finish-grinding wheels (4A, 4B) move into a forward position. At the same time or at least shortly afterward, the double spindles (1A, 1B) with the two sub-spindles (2A, 2B) and (3A, 3B) are fed in by the amount (19A, 19B) of the axial lifting movement of the inner sub-spindles (2A, 2B), taking into account the differing degree of wear on the rough-grinding and finish-grinding coverings (7A, 7B) and (5A, 5B).

At the instant illustrated in FIG. 3c), the finish-grinding wheels (4A, 4B) are already in the advanced position and their grinding coverings (5A, 5B), through further infeed of the double spindles (1A, 1B), are starting to grind into the semiconductor wafer 8 until the measurement means (20A, 20B) detect that the predetermined finish-ground target thickness 15 has been reached.

At the instant illustrated in FIG. 3d), the double spindles (1A, 1B) are fully retracted, the rotation of the semiconductor wafer 8 has stopped and the supply for the water or air cushions (11A, 11B) has been switched off. The semiconductor wafer is fixed to the non-moving side wall 10B of the grinding chamber, for example by the application of a vacuum 22 in the right-hand part of the grinding chamber, and the grinding chamber is opened by retracting the side wall 10A. Then, the semiconductor wafer is removed from the grinding chamber with the aid of an unloading device, for example a robot arm, so as to finish the grinding cycle.

FIG. 3e) shows the transition, without load changes, from rough-grinding to finish-grinding in accordance with the second embodiment of the method, as well as the non-planar intermediate form of the semiconductor wafer 8. This embodiment allows particularly gentle, but virtually continuous machining of the semiconductor wafer without interruption and without any imposed forces. Prior to the rough-grinding, the double spindles (1A, 1B) are inclined, preferably through symmetric angles (21A, 21B), so that the grinding wheels impart a non-planar intermediate form 18 to the semiconductor wafer 8 during rough-grinding.

Figure 3G:
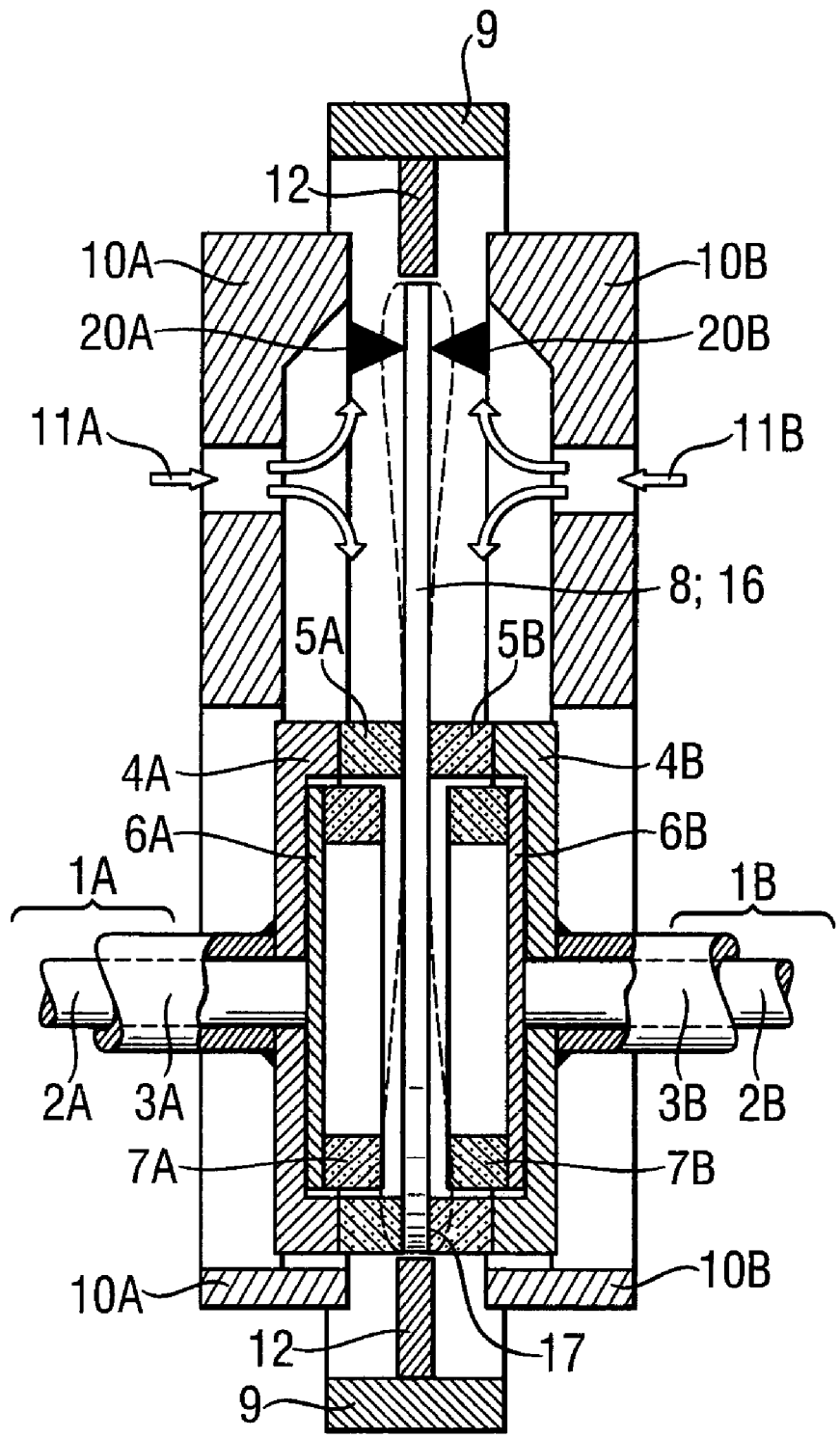
FIGS. 3a)-g) show the apparatus and a semiconductor wafer at various instants during the process, in each case separately for one embodiment (FIG. 3a)-d)) and for a second embodiment (FIG. 3e)-g)) of the process.
FIG. 3b) shows the rough-grinding of the semiconductor wafer.
FIG. 3c) shows the finish-grinding of the semiconductor wafer and FIG. 3d) shows the unloading of the grinding apparatus.
FIG. 3e) shows the transition from rough-grinding to finish-grinding without any load change in accordance with the second embodiment of the process and the non-planar intermediate form of the semiconductor wafer.
FIG. 3f) shows the placing of the finish-grinding wheel onto the semiconductor wafer, and FIG. 3g) shows the finish-grinding of the semiconductor wafer during production of the final planar shape of the semiconductor wafer.

As shown in FIG. 3f), the non-planar intermediate form 18 of the semiconductor wafer after rough-grinding allows the finish-grinding wheel (4A, 4B) to grind into the semiconductor wafer 8 particularly gently, with low levels of forces and without any abrupt load change. As it starts to grind into the semiconductor wafer 8, the finish-grinding wheel (4A, 4B) has essentially a point contact 17 with the semiconductor wafer 8, so that initially the machining forces are only very low. Prior to the finish-grinding of the semiconductor wafer, the setting angles (21A, 21B) are reduced, so that the double spindles are once again oriented co-linearly and the middle plane of the semiconductor wafer and the center plane between the grinding wheels are coplanar. The plane-parallel target form 16 shown in FIG. 3g) with a final thickness of the semiconductor wafer is produced by the finish-grinding. The grinding cycle is then completed in accordance with the description in connection with FIG. 3d.

FIG. 4a) lists the main steps involved in a general process for producing particularly flat and plane-parallel semiconductor wafers with at least one polished face, in which the single-machine double-spindle, double-side simultaneous grinding (DDDG), in accordance with the present invention, is one of the steps of the overall process. The main steps in the sequence comprise (1) separation of semiconductor wafers from an ingot, in particular from a single crystal (2), the DDDG and (3) the polishing of at least one face of the ground semiconductor wafer.

FIG. 4b) lists particularly preferred embodiments of the overall process which encompass further process steps. Arrows drawn by continuous lines represent obligatory process steps, and arrows drawn in dashed lines represent additional, optional process steps; the list of optional steps is only exemplary and is not limiting. The embodiments are divided into two different core sequences, namely (1) comprises the steps separation→edge rounding→DDDG→finish-polishing and (2) comprises the steps separation→DDDG→edge rounding→finish-polishing.

In both core sequences, an etching step may optionally follow the mechanical machining step so as to remove material from one or both sides of the semiconductor wafer. Furthermore, the finish-polishing may optionally be preceded by preliminary polishing, which may be a simultaneous, double-side polishing (DSP) step or a sequential single-side polishing (SSP) step. Furthermore, the SSP may be a step which polishes only the back surface of the semiconductor wafer (backside touch-polish, BSTP). In addition, geometry finish remachining using a subaperture process, preferably magneto-rheological finishing (MRF), may take place between the preliminary polishing and the finish-polishing.

Application Examples

The following process parameters are among the preferred examples for an application of the DDDG process according to the invention:

In the case of rough-grinding, these parameters are as follows: a grinding wheel which is held by the inner or outer sub-spindle, has a grain size of 4-50 μm with diamond as the abrasive, ceramically or metallically bonded; grinding removal of 2×20 μm to 2×60 μm at a spindle rotational speed of 1000-12,000 rpm; a spindle infeed rate of 15-300 μm/min (based on both spindles); a semiconductor wafer rotational speed of 5-100 rpm; and cooling lubrication using 0.1-5 l/min of water. The result is a semiconductor wafer with rough-ground side faces having a roughness of 250-3000 Å RMS (using a profilometer with a 1-80 μm filter) and a total thickness variation TTV of 0.7-3 μm in the case of a process with coaxially arranged double spindles during rough-grinding.

In the case of finishing-grinding, the preferred parameters are: a grinding wheel held by the inner or outer sub-spindle with a grain size of 0.1-5 μm and with diamond, $CeO_2$, $Al_2O_3$, SiC, $BaCO_3$ abrasive, diamond being particularly preferred, bonded ceramically or using synthetic resin, or if appropriate, both ceramically and with synthetic resin, preferably with conglomerate bonding; material removal of 2×2.5 to 2×20 μm at a spindle rotational speed of 1000-12,000 rpm; a spindle infeed rate of 5-60 μm/min (based on both spindles); a semiconductor wafer rotational speed of 5-100 rpm; and cooling lubrication with 0.1-5 l/min of water. The result is a semiconductor wafer with finish-ground side faces having a roughness of 5-200 Å RMS (measured using a profilometer with 1-80 μm filter) and a total thickness variation TTV of <1 μm.

The preferable axial displacement of a DDDG apparatus with axially displaceable inner spindle is 5-25 mm, more preferably about 12 mm. The accuracy of the measurement appliance for in-situ recording of the thickness of a semiconductor wafer is preferably better than ±0.7 μm (2 σ value), the measurement preferably being carried out by mechanical scanning with capacitive or inductive measurement recording.

The result of a process in accordance with the core sequences (1) or (2) is a semiconductor wafer with a local flatness on a front surface of less than 16 nm in a measurement window of 2 mm×2 mm area and of less than 40 nm in a measurement window of 10 mm×10 mm area. A semiconductor wafer of this type likewise forms the subject matter of the present invention. It preferably has a surface roughness of at most 200 Å RMS and preferably substantially comprises silicon, a compound semiconductor, a strained silicon substrate, an SOI substrate or an sSOI substrate.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for planarizing a semiconductor wafer, comprising: holding the wafer in a workpiece holder in a free-floating position during grinding, double-side grinding the semiconductor wafer, in which the semiconductor wafer is simultaneously ground on both sides using two colinear, double spindle grinding tools, each double spindle having an inner sub-spindle with one of a rough or finish grinding wheel and an outer sub-spindle with the other of a rough or finish grinding wheel, wherein the double-side grinding grinds firstly by simultaneously rough-grinding opposite sides of wafer and then by simultaneously finish-grinding opposite sides of wafer, wherein the semiconductor wafer, between rough-grinding and finish-grinding, remains positioned in one grinding machine, and a substantially constant load is applied to the wafer during the transition from rough-grinding to finish-grinding.

2. The process of claim 1, wherein the semiconductor wafer is is polished after double-side grinding.

3. The process of claim 1, wherein an edge of the wafer is profiled by edge-rounding before or after double-side grinding.

4. The process of claim 1, wherein the wafer is treated with an etching medium after double-side grinding, so as to remove material from one or both sides of the wafer.

5. The process of claim 1, wherein the wafer acquires a nonplanar intermediate form during rough-grinding and a planar final form during finish grinding.

6. The process of claim 1, wherein the wafer, after double-side grinding, is subjected to a material-removing subaperture process and is then polished.

7. The process of claim 1, wherein the wafer, after double-side grinding, is subjected to material-removal polishing and finish polishing.

8. The process of claim 7, wherein the material-removal polishing comprises double-side polishing or single-side polishing.

9. The process as claimed in claim 7, wherein the material-removal polishing comprises polishing only a back surface of the wafer.

10. The process of claim 9, wherein the material-removal polishing of the back surface of the wafer comprises a short polish which removes less than 5 μm of material from the back surface.

11. The process of claim 7, wherein the wafer, prior to finish-polishing, is subjected to a material-removing subaperture process.

12. The process of claim 6, wherein the wafer is machined using a magneto-rheological medium during the subaperture process.

13. The process of claim 11, wherein the wafer is machined using a magneto-rheological medium during the subaperture process.

14. The process of claim 1, wherein the colinearly mounted rough grinding wheels and colinearly mounted fine grinding wheels are respectively mounted on coaxial inner and outer spindles.

15. An apparatus suitable for the double-side grinding of flat workpieces comprising: a workpiece holder for holding the workpiece in a free-floating position during grinding, two colinear double spindlegrinding tools, each double spindle having an inner sub-spindle with one of a rough or finish grinding wheel and an outer sub-spindle with the other of a rough or finish grinding wheel, a device for loading and unloading a workpiece into the workpiece holder which is positioned between the double spindles, the sub-spindles positioned coaxially for grinding opposite sides of the workpiece, firstly by simultaneously rough-grinding opposite sides of workpiece and then by simultaneously finish-grinding opposite sides of workpiece, wherein the workpiece, between rough-grinding and finish-grinding, remains positioned in one grinding machine, and a substantially constant load is applied to the workpiece during the transition from rough-grinding to finish-grinding, at least one sub-spindle per double spindle being axially displaceable independently of the other sub-spindle of the double spindle.

16. The apparatus of claim 15, wherein the double spindles can be inclined from a position in which they are arranged co-linearly into a position in which they include an angle.

* * * * *

UNITED STATES PATENT AND TRADEMARK OFFICE
CERTIFICATE OF CORRECTION

| | | |
|---|---|---|
| PATENT NO. | : 7,867,059 B2 | Page 1 of 1 |
| APPLICATION NO. | : 11/941171 | |
| DATED | : January 11, 2011 | |
| INVENTOR(S) | : Georg Pietsch | |

It is certified that error appears in the above-identified patent and that said Letters Patent is hereby corrected as shown below:

Column 10, Line 33, Claim 1:

After "each double spindle" delete "haying"
and insert -- having --.

Column 11, Line 3, Claim 10:

After "removes less than" delete "5 μn"
and insert -- 5 μm --.

Signed and Sealed this
Fifth Day of April, 2011

David J. Kappos
*Director of the United States Patent and Trademark Office*